US010536147B1

(12) United States Patent
Kumar et al.

(10) Patent No.: US 10,536,147 B1
(45) Date of Patent: Jan. 14, 2020

(54) LEVEL SHIFTER

(71) Applicant: Cadence Design Systems, Inc., San Jose, CA (US)

(72) Inventors: Vinod Kumar, Uttar Pradesh (IN); Karishma, Rajasthan (IN)

(73) Assignee: Cadence Design Systems, Inc., San Jose, CA (US)

( * ) Notice: Subject to any disclaimer, the term of this patent is extended or adjusted under 35 U.S.C. 154(b) by 141 days.

(21) Appl. No.: 15/635,886

(22) Filed: Jun. 28, 2017

(51) Int. Cl.
*H03K 19/0185* (2006.01)
*G11C 11/407* (2006.01)

(52) U.S. Cl.
CPC .... *H03K 19/018521* (2013.01); *G11C 11/407* (2013.01)

(58) Field of Classification Search
CPC ............ H03K 3/012; H03K 3/356113; H03K 3/35613; H03K 3/356165; H03K 19/01721; H03K 19/0185; H03K 19/018521; H03K 19/018528; G11C 11/407
See application file for complete search history.

(56) References Cited

U.S. PATENT DOCUMENTS 6,404,229 B1 * 6/2002 Barnes .................. H03K 3/012 326/119
2009/0033401 A1 * 2/2009 Kossel .............. H03K 3/35613 327/333
2012/0001672 A1 * 1/2012 Barrow ........... H03K 3/356165 327/333

OTHER PUBLICATIONS

Shapiro, Alexander et al., "Power Efficient Level Shifter for 16 nm FinFET Near Threshold Circuits", IEEE Transactions on Very Large Scale Integration (VLSI) Systems, vol. 24, No. 2, pp. 774-778 (Feb. 2016).

* cited by examiner

*Primary Examiner* — Lincoln D Donovan
*Assistant Examiner* — Diana J. Cheng
(74) *Attorney, Agent, or Firm* — Mark H. Whittenberger, Esq.; Holland & Knight LLP

(57) ABSTRACT

The present disclosure relates to an apparatus including level shifter circuitry configured to convert a voltage between one or more multi-voltage domains. The apparatus may include an integrated circuit having a cross-coupled latch including a first weak transistor cross-coupled with a second weak transistor. The integrated circuit may further include a first strong transistor in parallel with the first weak transistor and a second strong transistor in parallel with the second weak transistor. The integrated circuit may further include an inverter configured to toggle at least one of the first weak transistor and the second weak transistor.

17 Claims, 8 Drawing Sheets

500
502 504 506 508 510 511 512 513 514 516 518
MUXN MUXP VDDQ VDD DP_HV DN_HV DP_LV DN_LV SELECTN SELECTP MP1S MP1W MP2W MP2S MN1 MN2 BIASN
Weak PMOS Latch
Delay Element
Low vth NMOS
Thin-oxide devices
IN GND
Duty Cycle Corrector
OUTP_HV OUTN_HV

| DDR Mode | VDDQ Supply Range (V) | | | Speed (Mbps) |
|---|---|---|---|---|
| | Min | Typ | Max | |
| DDR4 | 1.14 | 1.2 | 1.26 | 3200 |
| LPDDR4 | 1.06 | 1.1 | 1.17 | 4266 |
| DDR5 (target) | 1.06 | 1.1 | 1.17 | 6400 |

| Process Node | Core supply (VDD) Range (V) | | |
|---|---|---|---|
| | Min | Typ | Max |
| 28nm | 0.81 | 0.9 | 0.99 |
| 16nm FinFet | 0.72 | 0.8 | 0.88 |
| 7nm FinFet | 0.675 | 0.75 | 0.825 |

400

600

| VDDQ Range | VDD Range | Output Duty cycle at node OUTP_HV (%) | Output Duty cycle at node OUTN_HV (%) | Data rate |
| --- | --- | --- | --- | --- |
| 1.06V-1.26V | 0.65V-0.825V | 48.85-52.9 | 47.95-51.78 | 9Gbps |

LEVEL SHIFTER

FIELD OF THE INVENTION

The present disclosure relates to electronic circuitry, and more specifically, to a level shifter that may be used in an input/output buffer to interact with a high speed dynamic random-access memory ("DRAM").

DISCUSSION OF THE RELATED ART

Improvements in complementary metal oxide semiconductor (CMOS) devices used in electronic circuitry, particularly digital circuitry used in microprocessors, have resulted in CMOS devices operating at lower voltages. However, input/output (I/O) circuits have not experienced the same reduction in their operating voltages. I/O voltages are typically higher than the core voltage, due to the higher voltages required for noise immunity and the technology lag of application-specific integrated circuit (ASIC) chips.

Implementation of an interface between circuits operating at different voltages requires conversion of the signal voltage levels to ensure that the signals are compatible with each other and that static current drain is minimized. This voltage conversion function may be accomplished by a "level shifter" circuit. In the lower voltage environment of current CMOS circuits, the level shifter needs to be extremely accurate and stable to ensure maximum performance for the I/O circuits and the microprocessor. Current CMOS level shifters, however, are not stable and require CMOS circuits to compensate for variations in voltage and current levels. These additional circuits require additional power and surface area on the integrated circuit. In addition, these circuits introduce complexity to the design and may, in certain circumstances, contribute to the instability of the level shifter.

As such, power density has become a major factor in modern microprocessor design. Existing level shifters have traditionally involved either a differential cascade voltage switch ("DCVS") level shifter, a Wilson current mirror in the amplifying stage, or a specialized circuit topology.

SUMMARY OF DISCLOSURE

In one or more embodiments of the present disclosure, a method for converting voltage between one or more multi-voltage domains in an electrical circuit is provided. The method may include splitting a PMOS cross-coupled latch of a level shifter circuitry into two parts, wherein the first part includes a first weak transistor and a first strong transistor and the second part includes a second weak transistor and a second strong transistor. The method may further include cross-coupling the first weak transistor and the second weak transistor to hold a state after a transition. The method may also include toggling at least one of the first weak transistor and the second weak transistor using a thin-oxide inverter.

One or more of the following features may be included. In some embodiments, the electrical circuit may not include an internal reference voltage. The method may also include holding a first state at a first node associated with the first weak transistor after a node transition. The method may further include holding a second state at a second node associated with the second weak transistor after a node transition. The method may also include activating the first strong transistor during a transition from a logic low state to a logic high state at the first node. The method may further include activating the second strong transistor during a transition from a logic low state to a logic high state at the second node. The method may also include receiving an input signal at the thin-oxide inverter.

In one or more embodiments of the present disclosure an apparatus including level shifter circuitry configured to convert a voltage between one or more multi-voltage domains is provided. The apparatus may include an integrated circuit including a cross-coupled latch having a first weak transistor cross-coupled with a second weak transistor. The integrated circuit may further include a first strong transistor in parallel with the first weak transistor and a second strong transistor in parallel with the second weak transistor. The integrated circuit may further include an inverter configured to toggle at least one of the first weak transistor and the second weak transistor.

One or more of the following features may be included. In some embodiments, the cross-coupled latch may be configured to hold a first state at a first node associated with the first weak transistor. The cross-coupled latch may be configured to hold a second state at a second node associated with the second weak transistor. The first strong transistor may be activated during a transition from a logic low state to a logic high state at the first node. The second strong transistor may be activated during a transition from a logic low state to a logic high state at the second node. The inverter may be a thin-oxide device. The cross-coupled latch may be a PMOS latch.

In one or more embodiments of the present disclosure, a system having an input/output "I/O" buffer is provided. The I/O buffer may include an integrated circuit having a cross-coupled latch having a first weak transistor cross-coupled with a second weak transistor. The integrated circuit may further include a first strong transistor in parallel with the first weak transistor and a second strong transistor in parallel with the second weak transistor. The integrated circuit may further include a thin-oxide inverter.

One or more of the following features may be included. In some embodiments, the cross-coupled latch may be configured to hold a first state at a first node associated with the first weak transistor. The cross-coupled latch may be configured to hold a second state at a second node associated with the second weak transistor. The first strong transistor may be activated during a transition from a logic low state to a logic high state at the first node. The second strong transistor may be activated during a transition from a logic low state to a logic high state at the second node. The cross-coupled latch may be a PMOS latch.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 6 is a diagram depicting results in accordance with an embodiment of the present disclosure;

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The present disclosure generally relates to devices and methods for incorporating a new level shifter design into an integrated circuit. As technology advances the speed of DRAM is increasing. For example, the target speed for DDR5 DRAM is up to 6.4 Gbps. In order to interact with such high-speed DRAMs and other high-speed peripheral devices, high-speed I/O (Input/Output) buffers are needed. The level shifter is one of the key components of any high-speed output buffer. Accordingly, embodiments of the level shifter circuitry described herein provide a high-speed level shifter that may achieve the speed requirement for advanced DRAMS such as DDR5 and other high speed peripheral devices.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
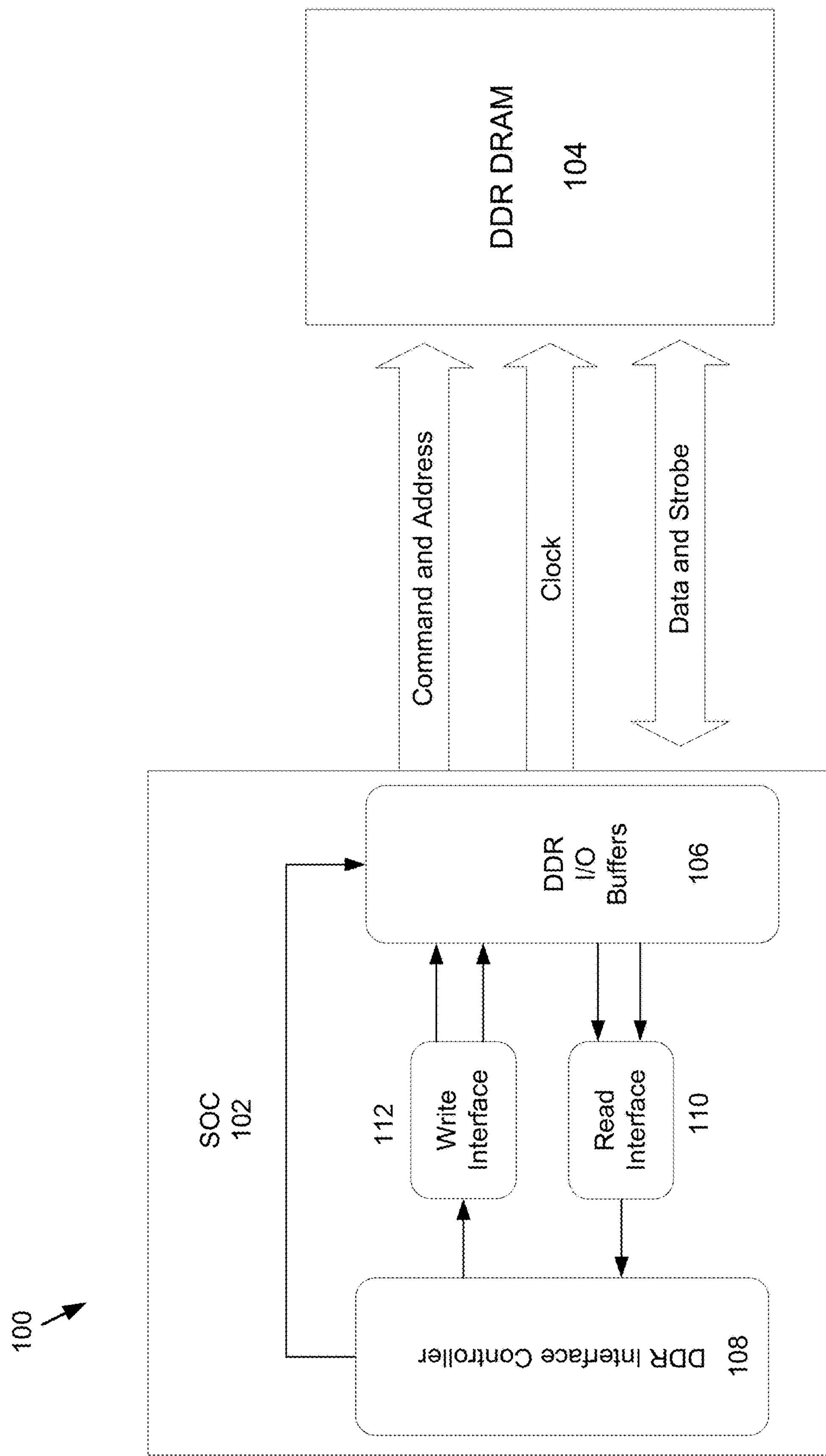
FIG. 1 is a diagram depicting an embodiment of level shifter circuitry within a DDR DRAM system environment.

Referring now to FIG. 1 an exemplary embodiment of an integrated circuit (IC) 100 in accordance with the present disclosure is shown. The term "integrated circuit", as used in any embodiment herein, may refer to a semiconductor device and/or microelectronic device, such as, for example, but not limited to, a semiconductor integrated circuit chip. The specific configuration, arrangement, and components shown in IC 100, as well as those shown in FIGS. 2-7, are provided merely for exemplary purposes as additional and/or alternative configurations are also within the scope of the present disclosure.

In some embodiments, IC 100 may include, in whole or in part, system-on-a-chip ("SoC") 102, which may be in electrical communication with DDR DRAM 104. SoC 102 and DDR DRAM 104 may be configured to exchange various types of information, some of which may include, but are not limited to, clock, command and address, data and strobe information, etc. SoC 102 may include DDR I/O Buffers 106 and DDR interface controller 108, which may be operatively connected via read and write interfaces 110 and 112 respectively.

Figure 2:
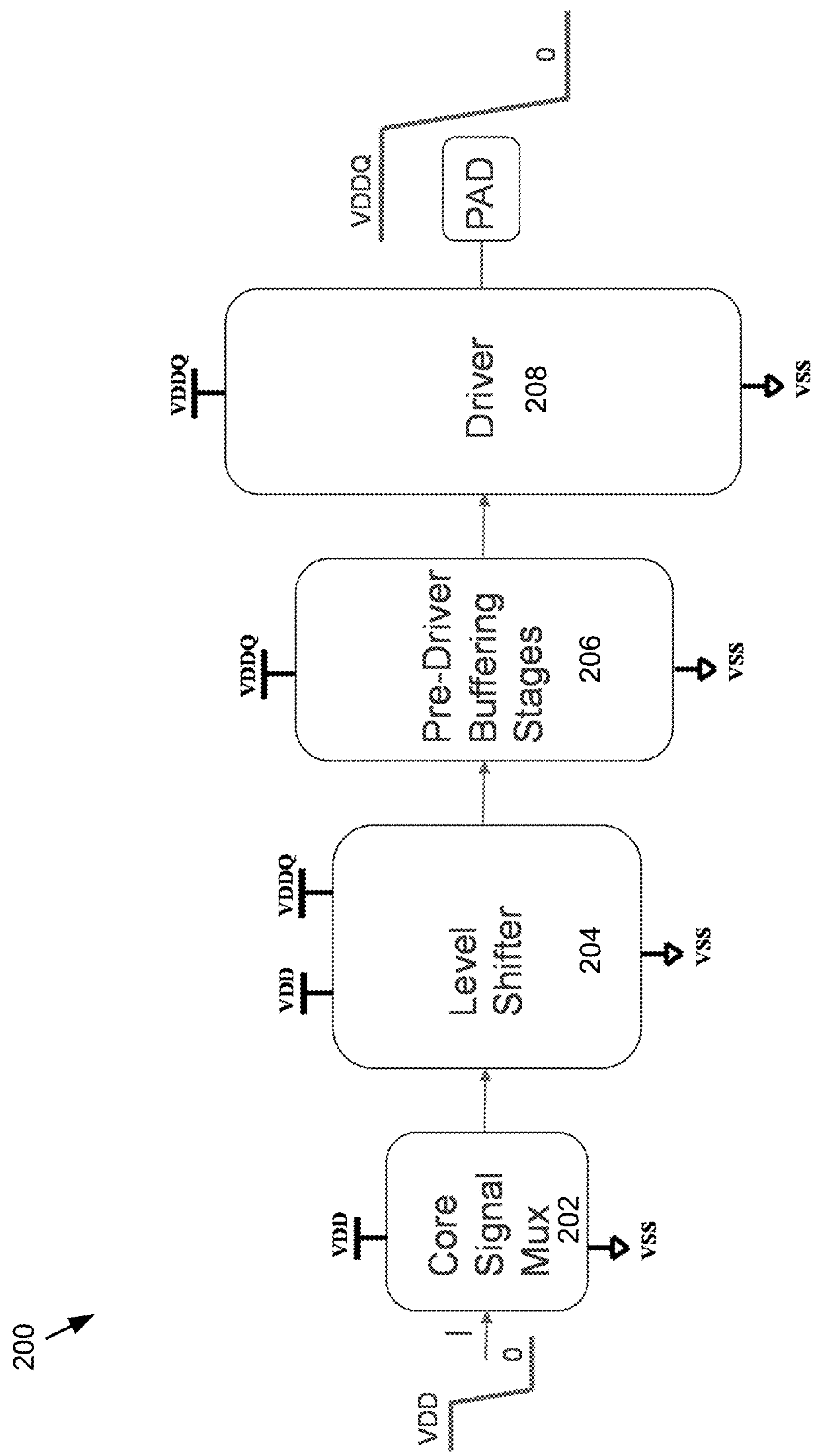
FIG. 2 is a diagram depicting an embodiment of level shifter circuitry within the DDR I/O block of FIG. 1.

Referring also to FIG. 2, an exemplary embodiment of an IC 200, which may include circuitry associated with DDR I/O Buffer 106 is provided. In some embodiments, IC 200 may include level shifter circuitry as is discussed in further detail hereinbelow. IC 200 may include core signal mux circuitry 202, level shifter circuitry 204, pre-driver buffering circuitry 206 and driver circuitry 208. In this particular example, VDD is the core Supply Voltage and VDDQ is the I/O Interface Supply Voltage.

Figure 3:
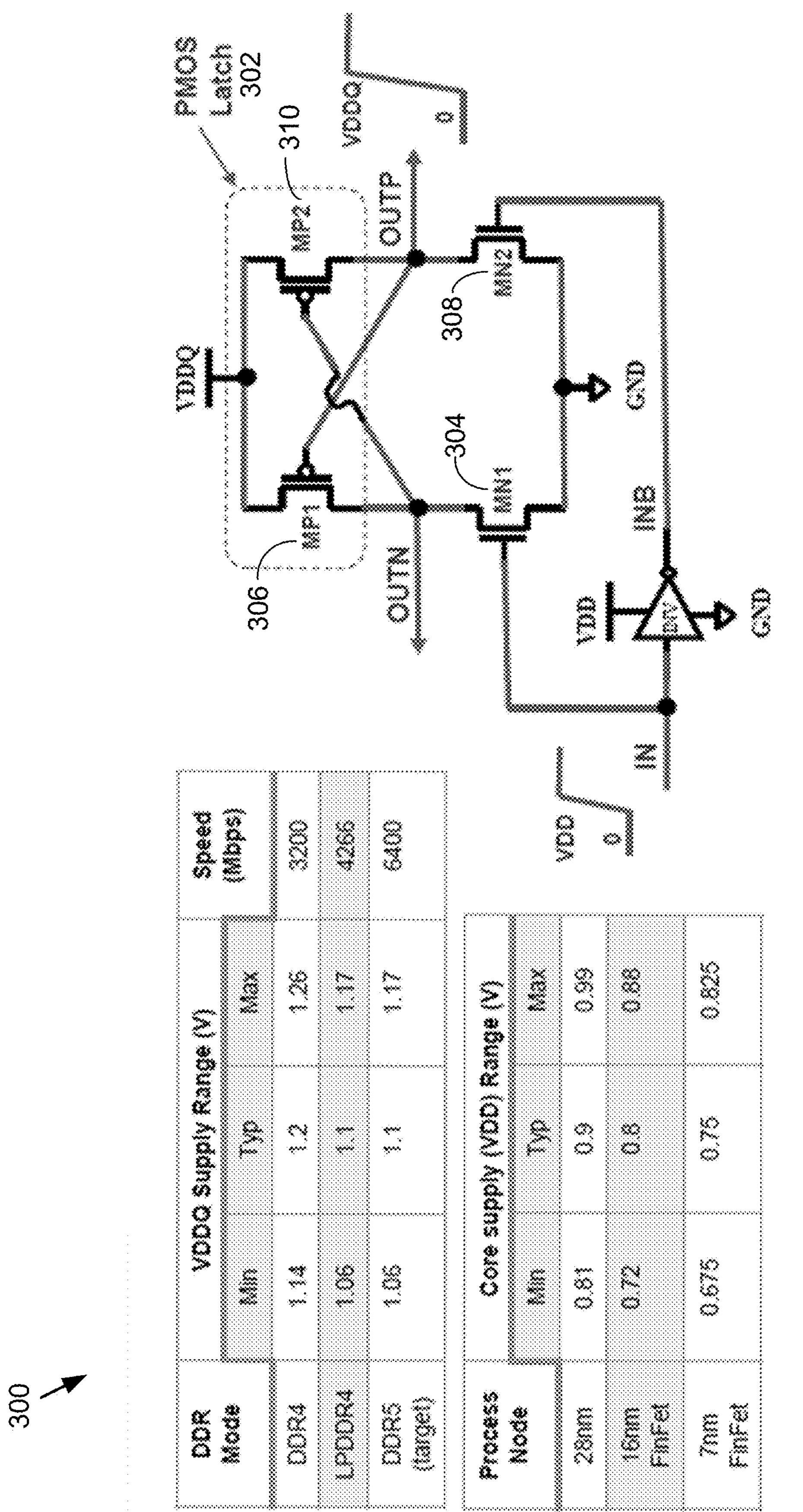
FIG. 3 is a diagram depicting an embodiment of level shifter circuitry in accordance with the present disclosure.

Referring also to FIG. 3, an exemplary embodiment of an IC 300 is provided. In some embodiments, IC 300 may include cross-coupled level shifter circuitry as shown in the PMOS latch 302 of FIG. 3. In operation, when the input data IN switches from logic low (0V) to logic high (VDD), the drive current of MN1 304 needs to be higher than the drive current of MP1 306 so that the PMOS latch circuitry 302 may toggle the state to transfer logic high (VDDQ) at the output (OUTP).

Similarly when input data IN switches from logic high (VDD) to logic low (0V) the drive current of MN2 308 needs to be higher than the drive current of MP2 310 so that the PMOS latch circuitry 302 may toggle the state to transfer logic low (0V) at output (OUTP). In some embodiments, in order to achieve higher speed in the cross-coupled level shifter the devices MP1 306 and MP2 310 of PMOS latch circuitry 302 needs to be strong enough to charge the node OUTP and node OUTN in the given bit period.

In operation, making the MP1 306 and MP2 310 strong results in a number of issues. For example, if the drive current of MP1 306 and MP2 310 become higher than the drive current of MN1 304 and MN2 308 then the input data will not be able to toggle the state of PMOS latch circuitry 302 and hence the level shifter get may fail. Moreover, if the drive current of MP1 306 and MP2 310 is smaller than the drive current of MN1 304 and MN2 308 the effective discharging current IDMN1-IDMP1 for node OUTN and IDMN2-IDMP2 for node OUTP may become very small and hence the speed of the level shifter may be limited by the discharging rate of node OUTP and OUTN. Since the VDD supply is small in comparison to the VDDQ supply any attempt to make MP1 306 and MP2 310 strong will force an increase in the size of MN1 304 and MN2 308 at very large values. The large size of MN1 304 and MN2 308 will increase the gate capacitance of MN1 304 and MN2 308 and hence limit the speed of the level shifter.

Figure 4:
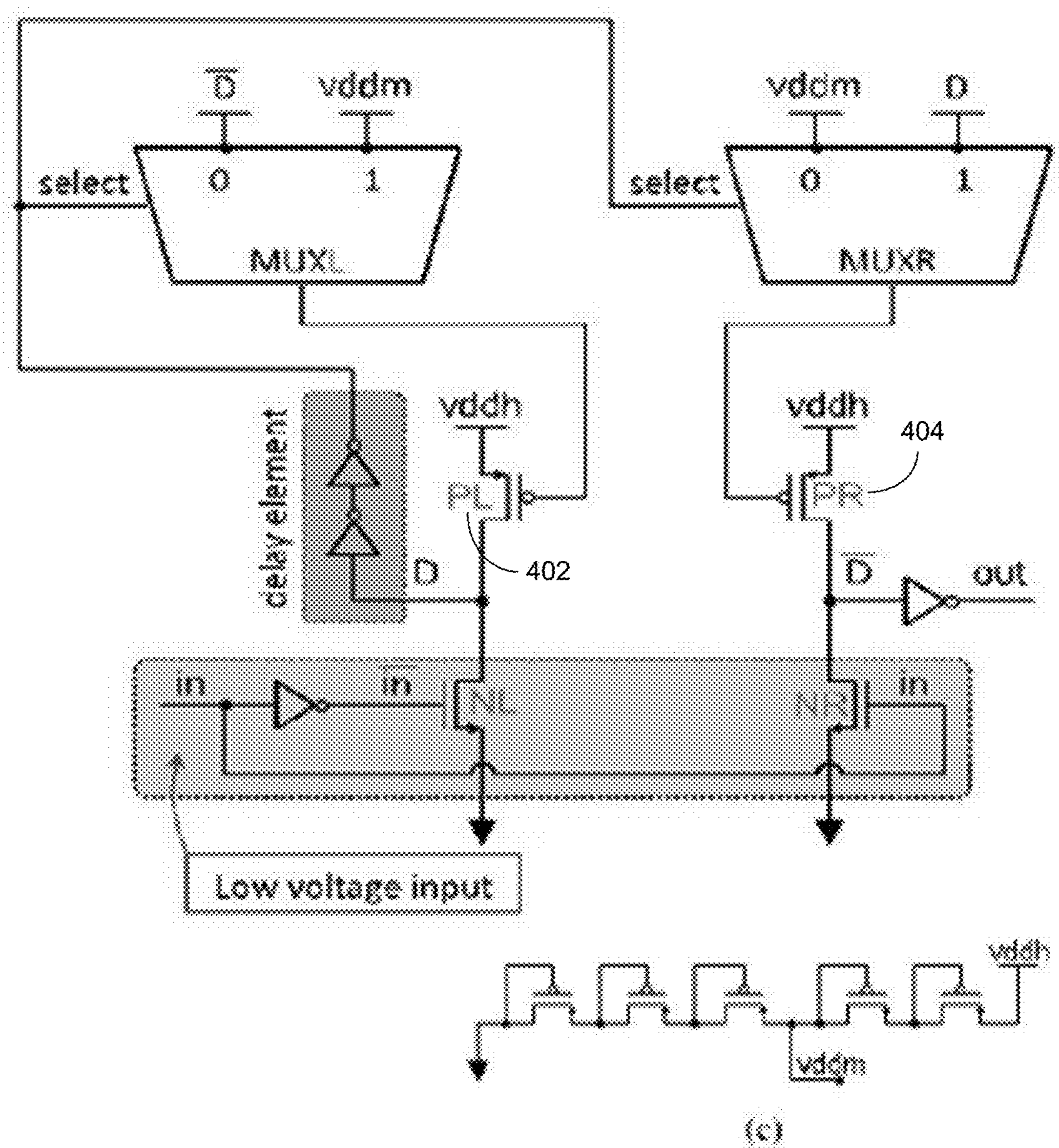
FIG. 4 is a diagram depicting an embodiment of level shifter circuitry in accordance with the present disclosure.

Referring now to FIG. 4, another exemplary embodiment of an integrated circuit (IC) 400 in accordance with the present disclosure is shown. IC 400 depicts an example where the gate voltage of a cross-coupled latch may be changed dynamically. For example, during a logic low to logic high transition on node D the gate voltage of device PL 402 may be connected to D-bar to make the PL 402 strong. After transition the gate voltage of device PL 402 may be connected to the intermediate voltage VDDM to make PL 402 weak. The same mechanism may be used for device PR 404 during logic low to logic high transition on node D-bar. However, this approach is suboptimal as an internal reference voltage VDDM needs to be generated, which wastes DC power. If the internal reference voltage VDDM is weak it will degrade the performance of the level shifter at high speeds. This type of design also requires additional area for a VDDM generator. As used herein, the term "weak" may refer to situation where the device drive current is relatively small and the term "strong" may refer to a situation where the device drive current is relatively large.

Figure 5:
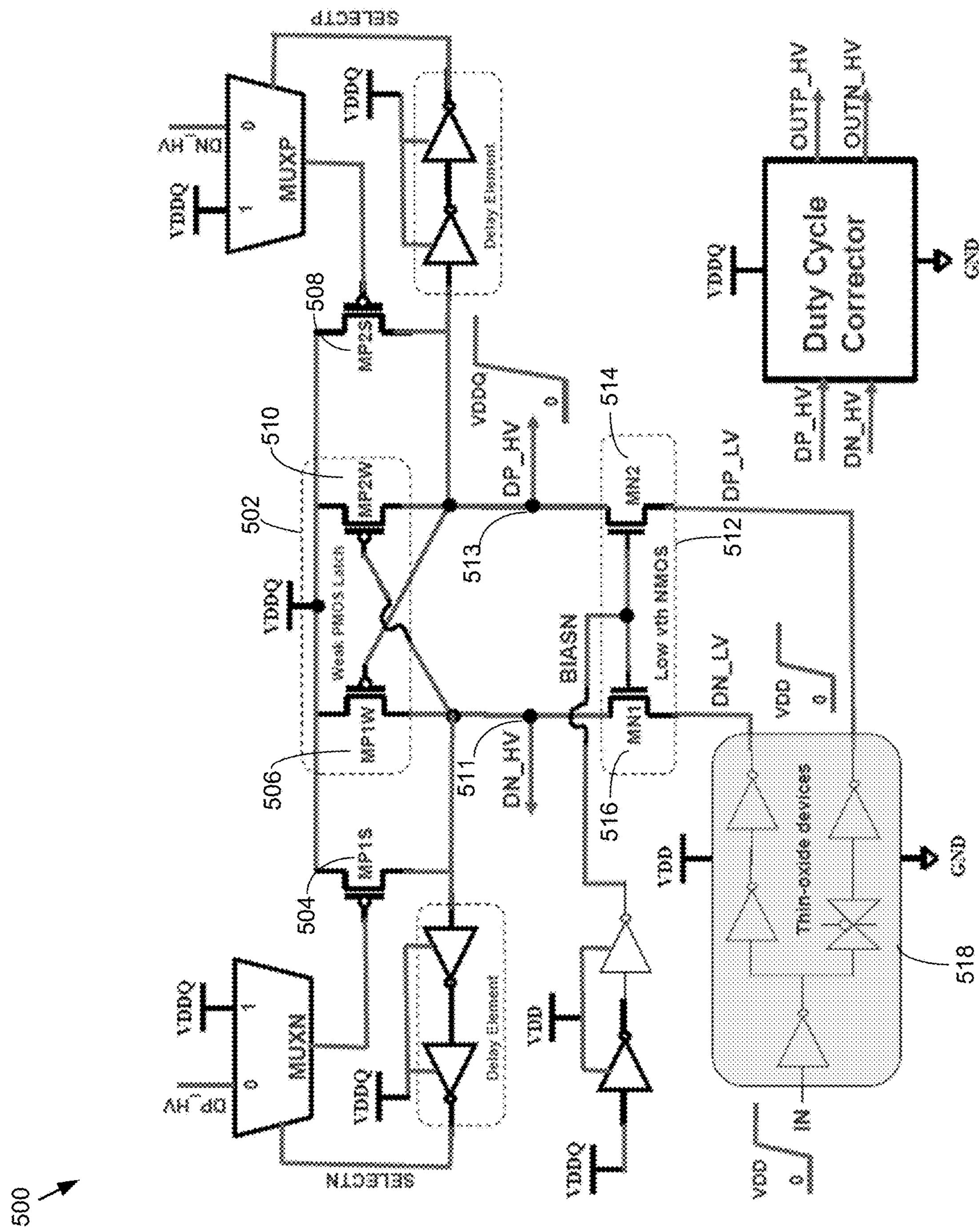
FIG. 5 is a diagram depicting an embodiment of level shifter circuitry in accordance with the present disclosure.

Referring now to FIG. 5, an embodiment of level shifter circuitry 500 consistent with the teachings of the present disclosure is provided. Level shifter circuitry 500 depicts a PMOS 502 cross-coupled latch that has been split into two parts. For example, MP1 is split into MP1S (strong) 504 and MP1W (weak) 506 and MP2 is split into MP2S (strong) 508 and MP2W (weak) 510. In some embodiments, level shifter circuitry 500 may be configured to use MP1W 506 and MP2W 510 as a weak cross-coupled latch to hold the state at node DP_HV and DN_HV after transition. In operation, level shifter circuitry 500 may be configured to turn-on the strong MP1S 504 only during logic low (0V) to logic high (VDDQ) transition at node DN_HV 511. The circuitry may also turn-on the strong PMOS 502 MP2S 508 only during the logic low (0V) to logic high (VDDQ) transition at node DP_HV 513. In some embodiments, and as shown in FIG. 5, level shifter circuitry 500 may be configured to use a thin-oxide strong inverter to toggle the state of cross-coupled weak PMOS latch 502. In some embodiments, a thin-oxide device 518 may be a core device having a relatively small gate-oxide thickness.

In operation, when input signal IN is logic low (0V), DP_LV is logic low (0V), DN_LV is logic high (VDD), DN_HV is logic high (VDDQ), and DP_HV is logic low (0V). At this state, the gate of strong MP1S 504 is connected to supply VDDQ through MUXN and the gate of strong MP2S 508 is connected to DN_HV through MUXP. Accordingly, both the strong MP1S 504 and MP2S 508 are off in this state. The node DN_HV is latched to VDDQ level through weak PMOS 502 MP1W 506 of the latch and node DP_HV is driven to ground through the strong thin-oxide inverter connected at node DP_LV. When the input signal IN switches from logic low (0V) to logic high (VDD) level, the node DP_LV may switch from 0V to VDD level which may turn-off the NMOS 512 MN2 514. The strong thin-oxide inverter connected at node DN_LV may pull-down the node DN_LV to logic low (0V) from VDD level, and turn-on the NMOS 512 MN1 516 connected between node DN_LV and DN_HV. Since the node DN_HV is driven to VDDQ through the weak MP1W 506, when MN1 516 turns-on it pulldown the node DN_HV to logic low level easily to turn-on the positive feedback of the weak PMOS latch 502 to toggle its state. As soon as DN_HV goes to logic low it may turn-on both the strong PMOS 502 MP2S 508 and weak PMOS 502 MP2W 510 connected at node DP_HV and hence node DP_HV may switch from logic low (0V) to logic high (VDDQ) level quickly.

In some embodiments, the logic high (VDDQ) level on node DP_HV may connect the gate of MP2S to VDDQ supply through MUXP, which may turn-off the MP2S 508 and hence node DP_HV is latched to VDDQ level through weak PMOS 502 MP2W 510. The logic low level (0V) on DN_HV may connect the gate of strong PMOS 502 MP1S 504 to DP_HV through MUXN.

In some embodiments, when the input signal IN is logic high (VDD), DP_LV is logic high (VDD), DN_LV is logic low (0V), DN_HV is logic low (0V), and DP_HV is logic high (VDDQ). At this state, the gate of strong PMOS 502 MP1S 504 may be connected to DP_HV through MUXN and gate of strong PMOS 502 MP2S 508 may be connected to VDDQ supply through MUXP. Accordingly, both the strong PMOS 502 MP1S 504 and MP2S 508 are off in this state. The node DP_HV may be latched to VDDQ level through weak PMOS 502 MP2W 510 of the latch and node DN_HV may be driven to ground through strong thin-oxide inverter connected at node DN_LV. When the input signal IN switches from logic high (VDD) to logic low (0V) level, the node DN_LV may switch from 0V to VDD level which may turn-off the NMOS 512 MN1 516. The strong thin-oxide inverter connected at node DP_LV may pull-down the node DP_LV to logic low (0V) from VDD level, and turn-on the NMOS 512 MN2 514 connected between node DP_LV and DP_HV. Since the node DP_HV is driven to VDDQ through the weak PMOS 502 MP2W 510, when MN2 514 turns-on it may pulldown the node DP_HV to logic low level easily to turn-on the positive feedback of the weak PMOS latch 502 to toggle its state. In some embodiments, as soon as DP_HV goes to logic low it may turn-on both the strong PMOS 502 MP1S 504 and weak PMOS 502 MP1W 506 connected at node DN_HV and hence node DN_HV may switch from logic low (0V) to logic high (VDDQ) level quickly. The logic high (VDDQ) level on node DN_HV may connect the gate of MP1S 504 to VDDQ supply through MUXN, which may turn-off the MP1S 504 and hence node DN_HV may be latched to VDDQ level through weak PMOS 502 MP1W 506. The logic low level (0V) on DP_HV may connect the gate of strong PMOS 502 MP2S 508 to DN_HV through MUXP.

Figure 7:
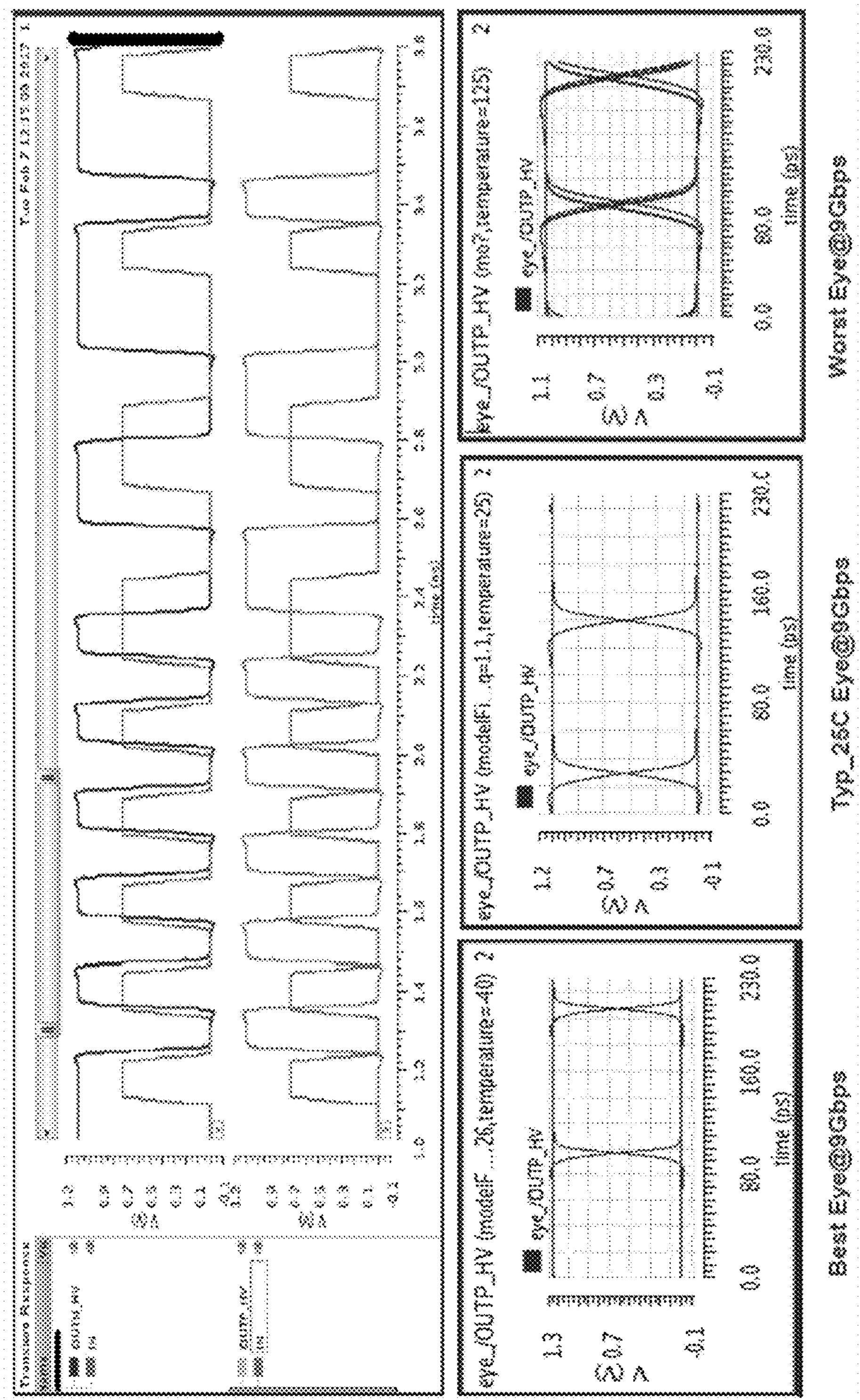
FIG. 7 is a diagram depicting simulated output waveform results in accordance with an embodiment of the present disclosure.

Referring now to FIGS. 6-7 examples of simulation results and waveforms are provided, which were generated in accordance with the teachings of the present disclosure. FIG. 6 shows the duty cycle obtained using the level shifter circuitry of FIG. 5 across 32 corner simulations. Some of these include, 4 process (ss, ff, sf, fs)×2Temp (125° C., −40° C.)×2VDD(0.65V, 0.825V)×2VDDQ (1.06V, 1.26V)=32 corners. The duty cycle of input signal at node IN is 50%. FIG. 7 shows the simulated output waveform at a 9GBPS data rate.

Figure 8:
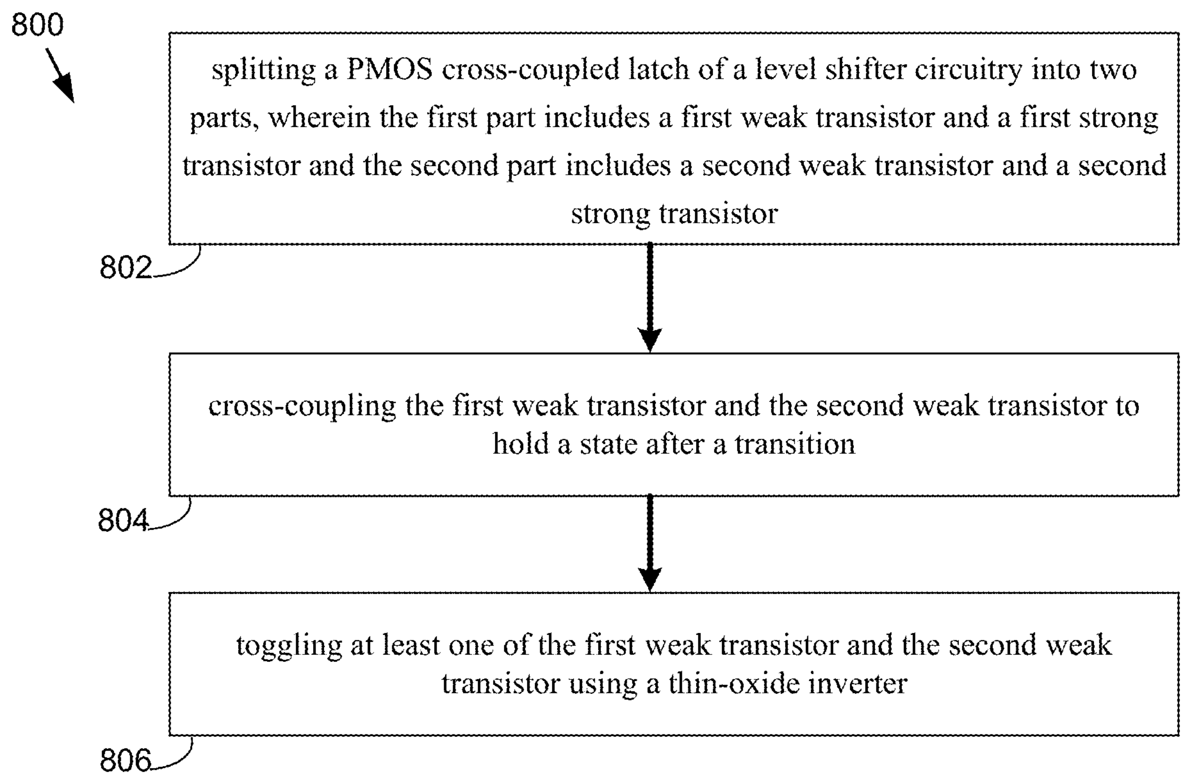
FIG. 8 is a flowchart depicting operations consistent with the level shifting process in accordance with an embodiment of the present disclosure.

Referring now to FIG. 8, a flowchart 800 depicting an embodiment consistent with the level shifting process described herein is provided. Level shifting process may be configured to convert a voltage between one or more multi-voltage domains. The process may include splitting (802) a PMOS cross-coupled latch of a level shifter circuitry into two parts, wherein the first part includes a first weak transistor and a first strong transistor and the second part includes a second weak transistor and a second strong transistor. The method may further include cross-coupling (804) the first weak transistor and the second weak transistor to create a PMOS cross-coupled latch configured to hold a state after a transition. The method may also include toggling (806) at least one of the first weak transistor and the second weak transistor using a thin-oxide inverter. Numerous other operations are also within the scope of the present disclosure.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for converting voltage between one or more multi-voltage domains in an electrical circuit comprising:

splitting a PMOS cross-coupled latch of a level shifter circuitry into two parts, wherein the first part includes a first weak transistor and a first strong transistor and the second part includes a second weak transistor and a second strong transistor;

activating, based upon, at least in part, a multiplexer selection, the first strong transistor during a logic low to logic high transition on a first node where a first strong drain terminal is connected;

cross-coupling the first weak transistor and the second weak transistor to hold a state after a transition, wherein a drain of the first strong transistor is connected to a gate of the first strong transistor or a drain of the second strong transistor is connected to a gate of the second strong transistor; and toggling at least one of the first weak transistor and the second weak transistor using a thin-oxide inverter.

2. The method of claim 1, wherein the electrical circuit does not include an internal reference voltage.

3. The method of claim 1, further comprising:

holding a first state at a first node associated with the first weak transistor after a node transition.

4. The method of claim 3, further comprising:

holding a second state at a second node associated with the second weak transistor after a node transition.

5. The method of claim 1, further comprising:

activating the second strong transistor during a logic low to logic high transition on a second node where a second strong drain terminal is connected.

6. The method of claim 1, further comprising:

receiving an input signal at the thin-oxide inverter.

7. An apparatus including level shifter circuitry configured to convert a voltage between one or more multi-voltage domains comprising:

an integrated circuit including a cross-coupled latch having a first weak transistor cross-coupled with a second weak transistor, wherein a drain of the first strong transistor is connected to a gate of the first strong transistor or a drain of the second strong transistor is connected to a gate of the second strong transistor, the integrated circuit further including a first strong transistor in parallel with the first weak transistor and a second strong transistor in parallel with the second weak transistor, the integrated circuit further including an inverter configured to toggle at least one of the first weak transistor and the second weak transistor, wherein the integrated circuit further includes a multiplexer configured to activate the first strong transistor during a logic low to logic high transition on a first node where a first strong drain terminal is connected.

8. The apparatus of claim 7, wherein the cross-coupled latch is configured to hold a first state at a first node associated with the first weak transistor.

9. The apparatus of claim 8, wherein the cross-coupled latch is configured to hold a second state at a second node associated with the second weak transistor.

10. The apparatus of claim 9, wherein the second strong transistor is activated during a transition from a logic low state to a logic high state at the second node.

11. The apparatus of claim 7, wherein the inverter is a thin-oxide device.

12. The apparatus of claim 7, wherein the cross-coupled latch is a PMOS latch.

13. A system comprising:

an input/output "I/O" buffer including an integrated circuit having a cross-coupled latch having a first weak transistor cross-coupled with a second weak transistor, wherein a drain of the first strong transistor is connected to a gate of the first strong transistor or a drain of the second strong transistor is connected to a gate of the second strong transistor, the integrated circuit further including a first strong transistor in parallel with the first weak transistor and a second strong transistor in parallel with the second weak transistor, the integrated circuit further including a thin-oxide inverter, wherein the integrated circuit further includes a multiplexer configured to activate the first strong transistor during a logic low to logic high transition on a first node where a first strong drain terminal is connected.

14. The system of claim 13, wherein the cross-coupled latch is configured to hold a first state at a first node associated with the first weak transistor.

15. The system of claim 14, wherein the cross-coupled latch is configured to hold a second state at a second node associated with the second weak transistor.

16. The system of claim 15, wherein the second strong transistor is activated during a transition from a logic low state to a logic high state at the second node.

17. The system of claim 13, wherein the cross-coupled latch is a PMOS latch.

* * * * *